(12) United States Patent
Zhang et al.

(10) Patent No.: US 11,849,575 B2
(45) Date of Patent: Dec. 19, 2023

(54) CONCENTRIC STAIRCASE STRUCTURE IN THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Kun Zhang, Wuhan (CN); Cuicui Kong, Wuhan (CN); Zhong Zhang, Wuhan (CN); Wenxi Zhou, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 439 days.

(21) Appl. No.: 17/147,400

(22) Filed: Jan. 12, 2021

(65) Prior Publication Data

US 2022/0139941 A1 May 5, 2022

Related U.S. Application Data

(63) Continuation of application No. PCT/CN2020/124671, filed on Oct. 29, 2020.

(51) Int. Cl.
*H10B 41/20* (2023.01)
*H10B 41/10* (2023.01)
(Continued)

(52) U.S. Cl.
CPC ............ *H10B 41/20* (2023.02); *H10B 41/10* (2023.02); *H10B 41/35* (2023.02); *H10B 43/10* (2023.02); *H10B 43/20* (2023.02); *H10B 43/35* (2023.02)

(58) Field of Classification Search
CPC ........ H10B 41/20; H10B 41/10; H10B 41/35; H10B 43/10; H10B 43/20; H10B 43/35;
(Continued)

(56) References Cited

U.S. PATENT DOCUMENTS 10,186,452 B2 * 1/2019 Chang .................... H10B 41/27
10,446,575 B2 * 10/2019 Kim ........................ H10B 43/50
(Continued)

FOREIGN PATENT DOCUMENTS

CN 108630528 A 10/2018
CN 109690776 A 4/2019
(Continued)

OTHER PUBLICATIONS

International Search Report issued in corresponding International Application No. PCT/CN2020/124671, dated Jul. 26, 2021, 4 pages.

*Primary Examiner* — Allison Bernstein
(74) *Attorney, Agent, or Firm* — BAYES PLLC

(57) ABSTRACT

Embodiments of 3D memory devices having a concentric staircase structure and methods for forming the same are disclosed. In an example, a 3D memory device includes a memory array structure and a concentric staircase structure in an intermediate of the memory array structure. The concentric staircase structure includes a plurality of concentric zones in a radial direction in a plan view. Each of the plurality of concentric zones includes a plurality of stairs in a tangential direction in the plan view.

17 Claims, 18 Drawing Sheets

(51) Int. Cl.
  *H10B 41/35*    (2023.01)
  *H10B 43/10*    (2023.01)
  *H10B 43/20*    (2023.01)
  *H10B 43/35*    (2023.01)

(58) Field of Classification Search
  CPC ........ H10B 41/27; H10B 43/27; H10B 43/50; H10B 41/50
  See application file for complete search history.

(56) References Cited

U.S. PATENT DOCUMENTS

| | | |
|---|---|---|
| 2016/0351672 A1 | 12/2016 | Eom |
| 2018/0211968 A1 | 7/2018 | Lee et al. |
| 2019/0043880 A1 | 2/2019 | Lee et al. |
| 2019/0237477 A1* | 8/2019 | Baek .................... G11C 5/025 |
| 2019/0393240 A1 | 12/2019 | Kim et al. |

FOREIGN PATENT DOCUMENTS

| | | |
|---|---|---|
| CN | 10634872 A | 12/2019 |
| CN | 111403391 A | 7/2020 |

* cited by examiner

100

CONCENTRIC STAIRCASE STRUCTURE IN THREE-DIMENSIONAL MEMORY DEVICE AND METHOD FOR FORMING THE SAME

CROSS-REFERENCE TO RELATED APPLICATIONS

This application is continuation of International Application No. PCT/CN2020/124671, filed on Oct. 29, 2020, entitled "CONCENTRIC STAIRCASE STRUCTURE IN THREE-DIMENSIONAL MEMORY DEVICE AND METHOD FOR FORMING THE SAME," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices having a concentric staircase structure and methods for forming the same are disclosed herein.

In one example, a 3D memory device includes a memory array structure and a concentric staircase structure in an intermediate of the memory array structure. The concentric staircase structure includes a plurality of concentric zones in a radial direction in a plan view. Each of the plurality of concentric zones includes a plurality of stairs in a tangential direction in the plan view.

In another example, a 3D memory device includes a memory array structure and a concentric staircase structure in an intermediate of the memory array structure. The concentric staircase structure includes a plurality of sectors in a tangential direction in a plan view. Each of the plurality of sectors includes a plurality of stairs in a radial direction in the plan view.

In still another example, a method for forming a concentric staircase structure of a 3D memory device is disclosed. A plurality of sectors are formed in a tangential direction in a plan view in an intermediate of a dielectric stack comprising vertically interleaved sacrificial layers and dielectric layers. Each of the plurality of sectors is at different depths. In each of the plurality of sectors, a plurality of stairs are formed towards a center of the plurality of sectors in a radial direction in the plan view, such that each stair of the plurality of sectors are at different depths.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
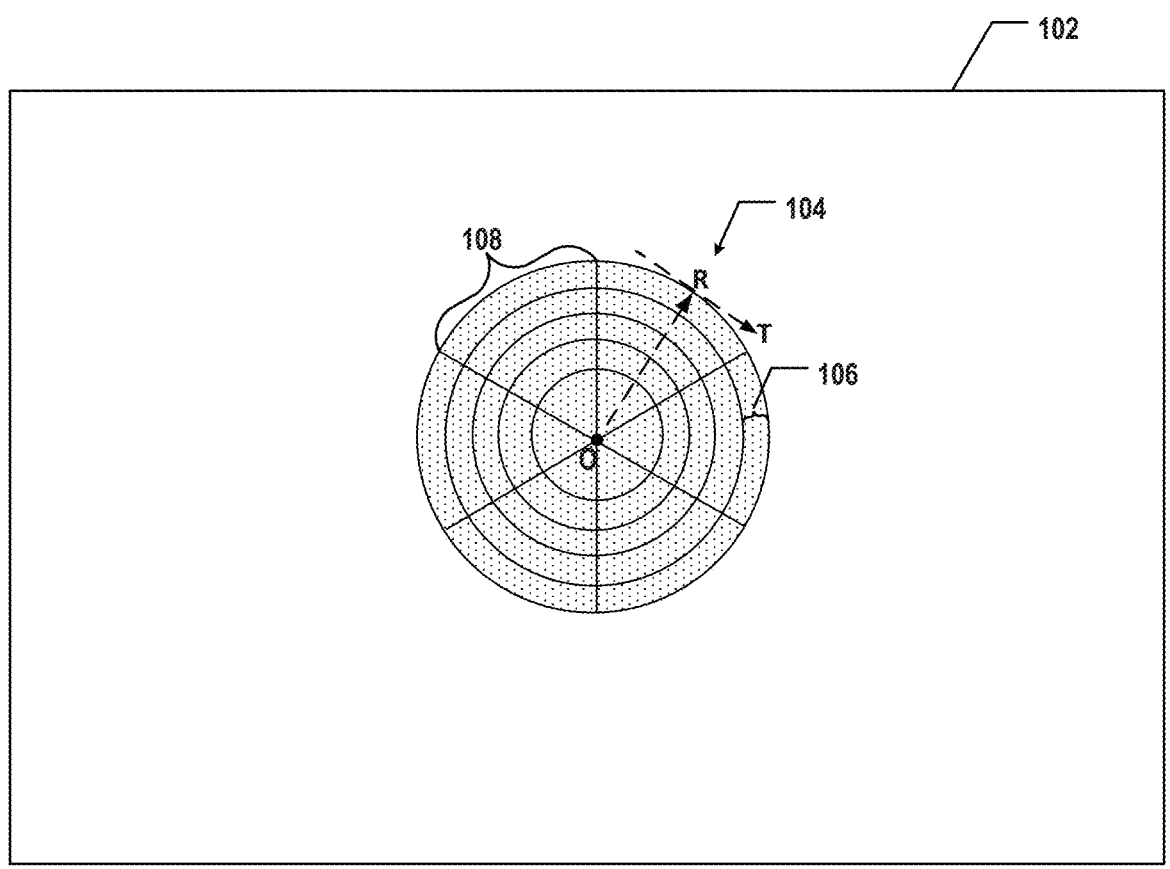
FIG. 1A illustrates a plan view of a 3D memory device having an exemplary concentric staircase structure, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more"

as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, memory cells for storing data are vertically stacked through a stacked storage structure (e.g., a memory stack). 3D memory devices usually include staircase structures formed on one or more sides (edges) or in the center of the stacked storage structure for purposes such as word line fan-out. Staircase structures are usually formed like terraced slopes at the edges or in the center of a memory stack in each memory plane. Staircase structures having a terraced slope-like shape, however, may cause unevenly distributed stress that is hard to control and balance. Moreover, as the levels of a staircase structure continue to increase, and the depth of each level decreases, the word line contact fabrication process becomes more and more challenging due to the increased chance of punching through the adjacent levels in the staircase structure, which can cause short-circuit for the staircase structure having a terraced slope-like shape.

Various embodiments in accordance with the present disclosure provide novel concentric staircase structures in the intermediate of a memory stack and fabrication methods thereof to better disperse stress caused by the staircase structures. The staircase structure can have a symmetric concentric layout, such as a concentric circles layout. Thus, the stress from the concentric staircase structure can be more easily controlled and balanced compared with conventional staircase structures having a terraced slope-like shape, thereby making the 3D memory device more stable and increasing the production yield. The symmetric concentric layout of the staircase structure can also reduce the chance of short-circuit due to word line contact punching through.

FIG. 1A illustrates a plan view of a 3D memory device 100 having an exemplary concentric staircase structure, according to some embodiments of the present disclosure. In some embodiments, 3D memory device 100 includes a memory array structure 102 having a memory cell array and a concentric staircase structure 104 in the intermediate of memory array structure 102 in the plan view. In some embodiments, concentric staircase structure 104 is in the intermediate of memory array structure 102, such as in the center of memory array structure 102, as shown in FIG. 1A. It is understood that in some examples, concentric staircase structure 104 may be in the intermediate, but not in the center, of memory array structure 102, i.e., in anywhere of memory array structure 102, in the plan view. In some embodiments, concentric staircase structure 104 is a functional staircase structure used for landing interconnects (e.g., word line contacts). It is understood that additional staircase structures (e.g., dummy staircase structures, not shown) may be formed at one or more sides of memory array structure 102 as well for balancing load in etching or chemical mechanical polishing (CMP) processes during and after the fabrication of 3D memory device 100. It is also further understood that in some examples, additional concentric staircase structure(s) 104 may be formed in memory array structure 102 as well as functional staircase structures and/or dummy staircase structures. It is noted that x and y axes are included in FIG. 1A to illustrate two orthogonal (perpendicular) directions in the wafer plane. The x-direction is the word line direction of 3D memory device 100, and the y-direction is the bit line direction of 3D memory device 100.

Memory array structure 102 can include a memory cell array. In some embodiments, 3D memory device 100 is a NAND Flash memory device in which memory cells are provided in the form of an array of NAND memory strings (not shown) in memory array structure 102. Memory array structure 102 can include any other suitable components including, but not limited to, gate line slits (GLSs), through array contacts (TACs), array common sources (ACSs), etc. Each word line of memory array structure 102 extends laterally in the x-direction in memory array structure 102 to a respective stair (level) in concentric staircase structure 104, according to some embodiments.

As shown in FIG. 1A, concentric staircase structure 104 includes a plurality of concentric zones 106 in a radial direction (e.g., the r-direction) in the plan view, and each concentric zone 106 includes a plurality of stairs in a tangential direction (e.g., the t-direction) in the plan view, according to some embodiments. In some embodiments, concentric staircase structure 104 has a concentric circles layout, and each concentric zone 106 corresponds to a respective concentric ring (i.e., an annulus, e.g., a region bounded by two concentric circles) with respect to the common center o, as shown in FIG. 1A. It is understood that the first concentric zone 106 from the center in the radial direction may correspond to a circle. The radial direction (e.g., the r-direction) and the tangential direction (e.g., the t-direction) are two orthogonal (perpendicular) directions with respect to the center o. In some embodiments, each concentric zone 106 has the same dimension in the radial direction, but different dimensions in the tangential direction in the plan view, as shown in FIG. 1A. The number of concentric zones 106 may vary in different examples depending on various factors, for example, the number of word lines and level of memory cells in 3D memory device 100, the planar dimension of each concentric zone 106, the height of each stair, etc.

As shown in FIG. 1A, concentric staircase structure 104 also includes a plurality of sectors 108 in the tangential direction, and each sector 108 includes a plurality of stairs in the radial direction in the plan view, according to some embodiments. In some embodiments, each sector 108 has the same shape and planar dimension and is bounded by two radiuses separated by the same angle from the center. In some embodiments, concentric staircase structure 104 has a concentric circles layout, and each sector 108 corresponds a circular sector, as shown in FIG. 1A. The number of sectors 108 and the angle thereof may vary in different examples depending on various factors, for example, the lateral dimension of concentric staircase structure 104, the pitch and critical dimension of word line contacts, etc.

As shown in FIG. 1A, concentric staircase structure 104 can be divided into a plurality of areas each having a respective stair as defined by concentric zones 106 and sectors 108. For example, each concentric zone 106 may include a plurality of stairs in the tangential direction, each of which is disposed in a respective sector 108; each sector 108 may include a plurality of stairs in the radial direction, each of which is disposed in a respective concentric zone 106. Thus, the number of stairs in concentric staircase structure 104 can be determined based on the number of concentric zones 106 and the number of sectors 108.

Figure 1B:
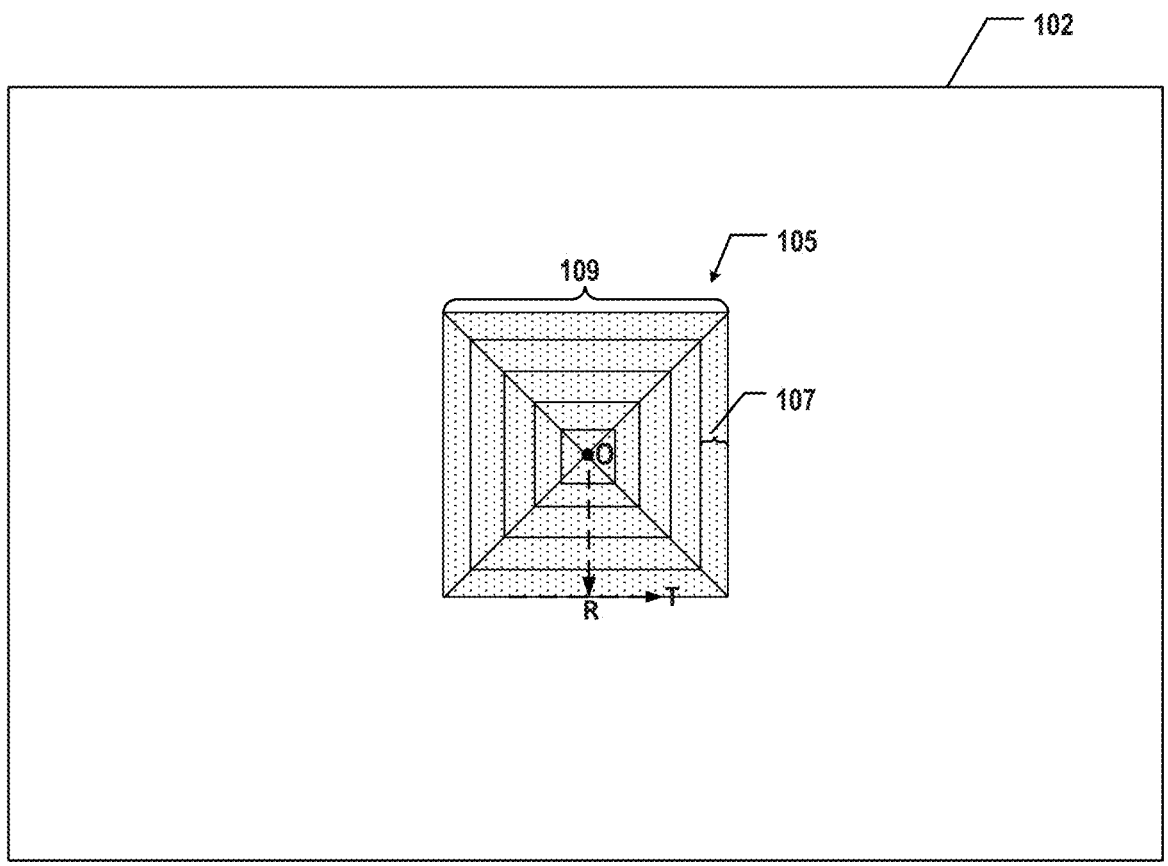
FIG. 1B illustrates a plan view of an exemplary 3D memory device having another exemplary concentric staircase structure, according to some embodiments of the present disclosure.

Although concentric staircase structure 104 in FIG. 1A has a concentric circles layout in the plan view, it is understood that a concentric staircase structure disclosed herein can have any other suitable concentric layout including, but not limited to, a concentric squares layout, a concentric rectangles layout, a concentric hexagons layout, a concentric octagons layout, etc., as long as the layout includes concentric objects with respect to a common center. For example, FIG. 1B illustrates a plan view of 3D memory device 100 having another exemplary concentric staircase structure 105, according to some embodiments of the present disclosure. Concentric staircase structure 105 is similar to concentric staircase structure 104 in FIG. 1A except that concentric staircase structure 105 has a concentric squares layout, as shown in FIG. 1B.

Concentric staircase structure 105 includes a plurality of concentric zones 107 in the radial direction in the plan view, each of which corresponds to a respective concentric square ring (i.e., a square annulus, e.g., a region bounded by two concentric squares) with respect to the common center o, as shown in FIG. 1B, according to some embodiments. It is understood that the first concentric zone 107 from the center in the radial direction may correspond to a square. Concentric staircase structure 105 also includes a plurality of sectors 109 in the tangential direction in the plan view, each of which corresponds to a right triangle, as shown in FIG. 1B, according to some embodiments.

In some embodiments, the concentric staircase structure disclosed here, for example, concentric staircase structure 104 or 105 described above, is symmetric with respect to the center, such that the stress introduced by the staircase structure can be better balanced and controlled, compared with conventional staircase structures having a terraced slope-like shape.

Figure 2:
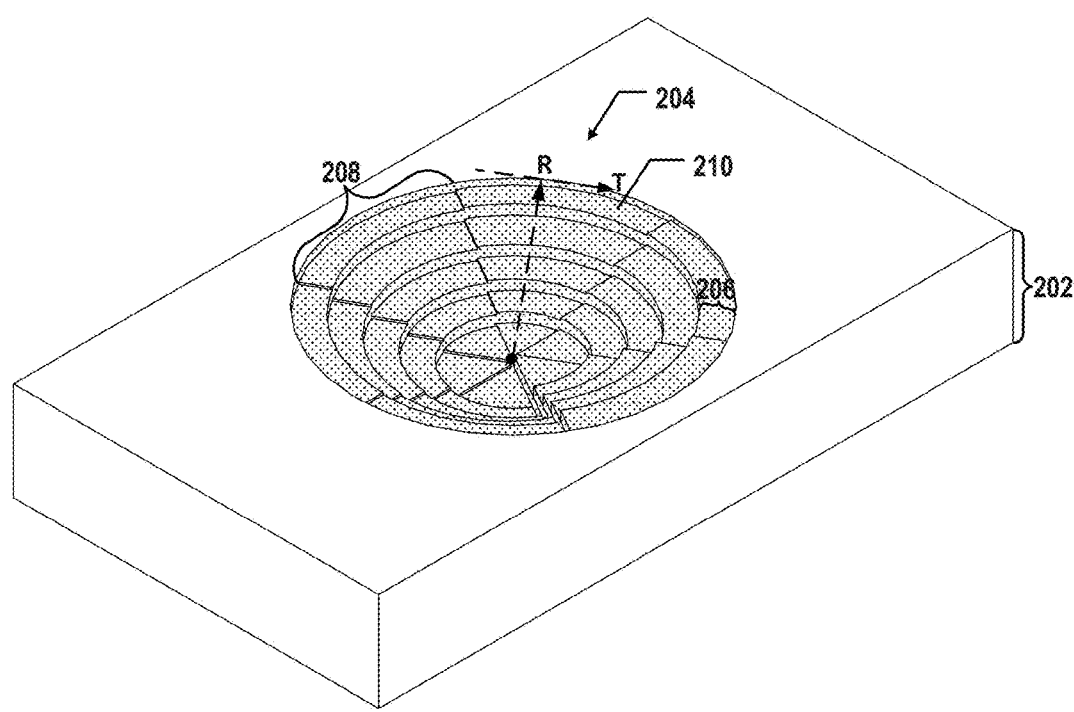
FIG. 2 illustrates a top front perspective view of an exemplary 3D memory device having a concentric staircase structure, according to some embodiments of the present disclosure.
Figure 2:
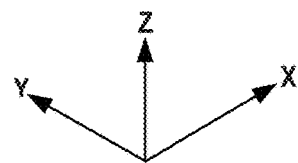

FIG. 2 illustrates a top front perspective view of an exemplary 3D memory device 200 having a concentric staircase structure, according to some embodiments of the present disclosure. 3D memory device 200 may be one example of 3D memory device 100 having concentric staircase structure 104 in FIG. 1A. 3D memory device 200 can include a memory stack 202 above a substrate (not shown), which can include silicon (e.g., single crystalline silicon), silicon germanium (SiGe), gallium arsenide (GaAs), germanium (Ge), silicon on insulator (SOI), or any other suitable materials.

It is noted that x, y, and z axes are included in FIG. 2 to further illustrate the spatial relationship of the components in 3D memory device 200. The substrate of 3D memory device 200 includes two lateral surfaces extending laterally in the x-y plane: a top surface on the front side of the wafer on which 3D memory device 200 can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of 3D memory device 200 is determined relative to the substrate of 3D memory device 200 in the z-direction (the vertical direction perpendicular to the x-y plane) when the substrate is positioned in the lowest plane of 3D memory device 200 in the z-direction. The same notion for describing the spatial relationships is applied throughout the present disclosure.

Memory stack 202 can include vertically interleaved conductive layers and dielectric layers. The conductive layers and dielectric layers can alternate in the vertical direction. In some embodiments, memory stack 202 can include a plurality of pairs of conductive layers and dielectric layers stacked vertically in the z-direction. The number of the pairs in memory stack 202 (e.g., 32, 64, 96, 128, 160, 192, 224, or 256) can determine the number of memory cells in 3D memory device 200. In some embodiments, 3D memory device 200 is a NAND Flash memory device, and memory stack 202 is a stacked storage structure through which NAND memory strings are formed. Each conductive layer can function as a gate line of the NAND memory strings and a word line extending laterally from the gate line and ending at a concentric staircase structure 204 for word line fan-out. Each dielectric layer can function as the gate-to-gate dielectric. The conductive layers can include conductive materials including, but not limited to, tungsten (W), cobalt (Co), copper (Cu), aluminum (Al), polycrystalline silicon (polysilicon), doped silicon, silicides, or any combination thereof. The dielectric layers can include dielectric materials including, but not limited to, silicon oxide, silicon nitride, silicon oxynitride, or any combination thereof. In some embodiments, the conductive layers include metals, such as tungsten, and the dielectric layers include silicon oxide.

Each stair 210 (as shown as a "level") of concentric staircase structure 204 can include one or more pairs of the conductive layers and dielectric layers (not shown). That is, the height of each stair 210 can be equal to the total thickness of one or more pairs of the conductive layers and dielectric layers. In some embodiments, the conductive of each stair is for interconnection in the vertical direction. In some embodiments, every two adjacent stairs of concentric staircase structure 204 are offset by a nominally same distance in the z-direction (i.e., the thickness) and a nominally same distance in the x-y plane. Each offset thus can form a "landing area" for interconnection with word line contacts (not shown) of 3D memory device 200 in the z-direction. In some embodiments, concentric staircase structure 204 is a functional staircase used for landing interconnects (e.g., word line via contacts), as opposed to a dummy staircase.

Figure 3:
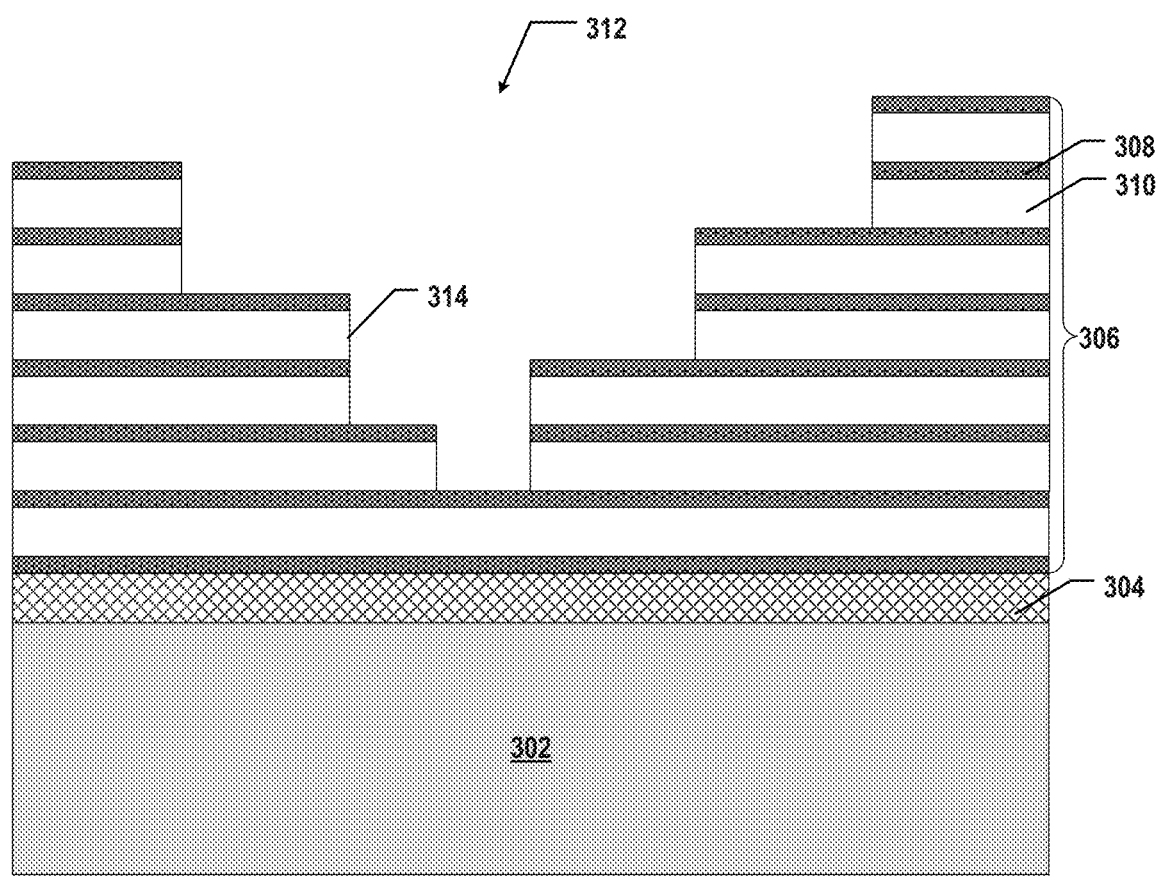
FIG. 3 illustrates a side view of an exemplary 3D memory device having a concentric staircase structure, according to some embodiments of the present disclosure.

For example, as shown in FIG. 3, a 3D memory device 300 (e.g., one example of 3D memory device 200) may include a memory stack 306 (e.g., one example of memory stack 202) above a substrate 302. A pad layer 304, such as a silicon oxide layer, may be formed vertically between substrate 302 and 306. Memory stack 306 may include vertically interleaved conductive layers 308 and dielectric layers 310, i.e., a plurality pairs of conductive layers 308 and dielectric layer 310. A concentric staircase structure 312 (e.g., one example of concentric staircase structure 204) may be formed in memory stack 306. Each stair 314 (e.g., one example of stair 210) of concentric staircase structure 312 may have an offset with adjacent stair 314 for landing interconnects (e.g., word line via contacts). The height of each stair 314 may be equal to the total thickness of two pairs of conductive layers 308 and dielectric layers 310, as shown in FIG. 3. It is understood in some examples, each stair 314 may be equal to the total thickness of more than two pairs of conductive layers 308 and dielectric layers 310, such as the example shown in FIG. 2.

Referring back to FIG. 2, concentric staircase structure 204 may be one example of concentric staircase structure 104 in FIG. 1A. As shown in FIG. 2, concentric staircase structure 204 has a concentric circles layout, according to some embodiments. Concentric staircase structure 204 can include a plurality of concentric zones 206 in a radial direction (e.g., the r-direction) in the plan view, and each concentric zone 206 can include a plurality of stairs 210 in a tangential direction (e.g., the t-direction) in the plan view. In some embodiments, each concentric zone 206 corresponds to a respective concentric ring with respect to the common center o, as shown in FIG. 2. It is understood that the first concentric zone 206 from the center in the radial direction may correspond to a circle. In some embodiments, each concentric zone 206 has the same dimension in the radial direction, but different dimensions in the tangential direction in the plan view, as shown in FIG. 2. As shown in FIG. 2, concentric staircase structure 204 can also include a plurality of sectors 208 in the tangential direction, and each sector 208 includes a plurality of stairs 210 in the radial direction in the plan view. Each sector 208 can have the same shape and planar dimension in the x-y plane and is bounded by two radiuses separated by the same angle from the center. In some embodiments, each sector 208 corresponds a circular sector, as shown in FIG. 2. In some embodiment as shown in FIG. 2, concentric staircase structure 204 includes six circular sectors 208 each bounded by two radiuses separated by 60 degrees.

As shown in FIG. 2, concentric staircase structure 204 can be divided into a plurality of areas each having a respective stair 210 as defined by concentric zones 206 and sectors 208. For example, each concentric zone 206 may include a plurality of stairs 210 in the tangential direction, each of which is disposed in a respective sector 208; each sector 208 may include a plurality of stairs in the radial direction, each of which is disposed in a respective concentric zone 206. Thus, the number of stairs in concentric staircase structure 204 can be determined based on the number of concentric zones 206 and the number of sectors 208.

In some embodiments, in each concentric zone 206, stairs 210 thereof are at different depths. For example, the depths of stairs 210 in each concentric zone 206 decrease counter-clockwise in the tangential direction, as shown in FIG. 2. That is, there are no two or more stairs 210 in the same concentric zone 206 that have the same depth, i.e., being coplanar with one another, according to some embodiments. It is understood that the depths of stairs 210 in one concentric zone 206 may not continuously change in the same way as long as their depths are different. In some embodiments, in each concentric zone 206, stairs 210 thereof have a nominally same lateral dimension, e.g., in the tangential direction and/or the radial direction.

Similarly, in some embodiments, in each sector 208, stairs 210 thereof are at different depths. For example, the depths of stairs 210 in sector 208 decrease towards the center in the radial direction, as shown in FIG. 2. That is, there is no two or more stairs 210 in the same sector 208 that have the same depth, i.e., being coplanar with one another, according to some embodiments. In some embodiments, in each sector 208, stairs 210 thereof have different lateral dimensions, e.g., in the tangential direction. For example, the lateral dimensions of stairs 210 in the tangential direction in each sector 208 may decrease towards the center in the radial direction, as shown in FIG. 2. It is understood that in each sector 208, stairs 210 thereof may have another nominally same lateral dimension, e.g., in the radial direction.

By varying the depths of stairs 210 in concentric zones 206 and in sectors 208, each stair 210 of concentric staircase structure 204 are at different depths, according to some embodiments. That is, there are no two or more stairs 210 in concentric staircase structure 204 that have the same depth, i.e., being coplanar with one another, according to some embodiments. As a result, each stair 210 in concentric staircase structure 204 can be used for landing interconnects (e.g., word line contacts) in contact with a respective word line at a different level. For example, as shown in FIG. 3, each stair 314 of concentric staircase structure 312 may be at different depths for landing interconnects (e.g., word line contacts, not shown) in contact with a respective word line (conductive layer 308) at a different level. Although not shown in FIG. 2, it is understood that in some examples, each stair 210 may include multiple divisions with different depths in the tangential direction or the radial direction and each connecting to a respective word line to further increase the word line fan-out capability of concentric staircase structure 204.

Figure 4A:
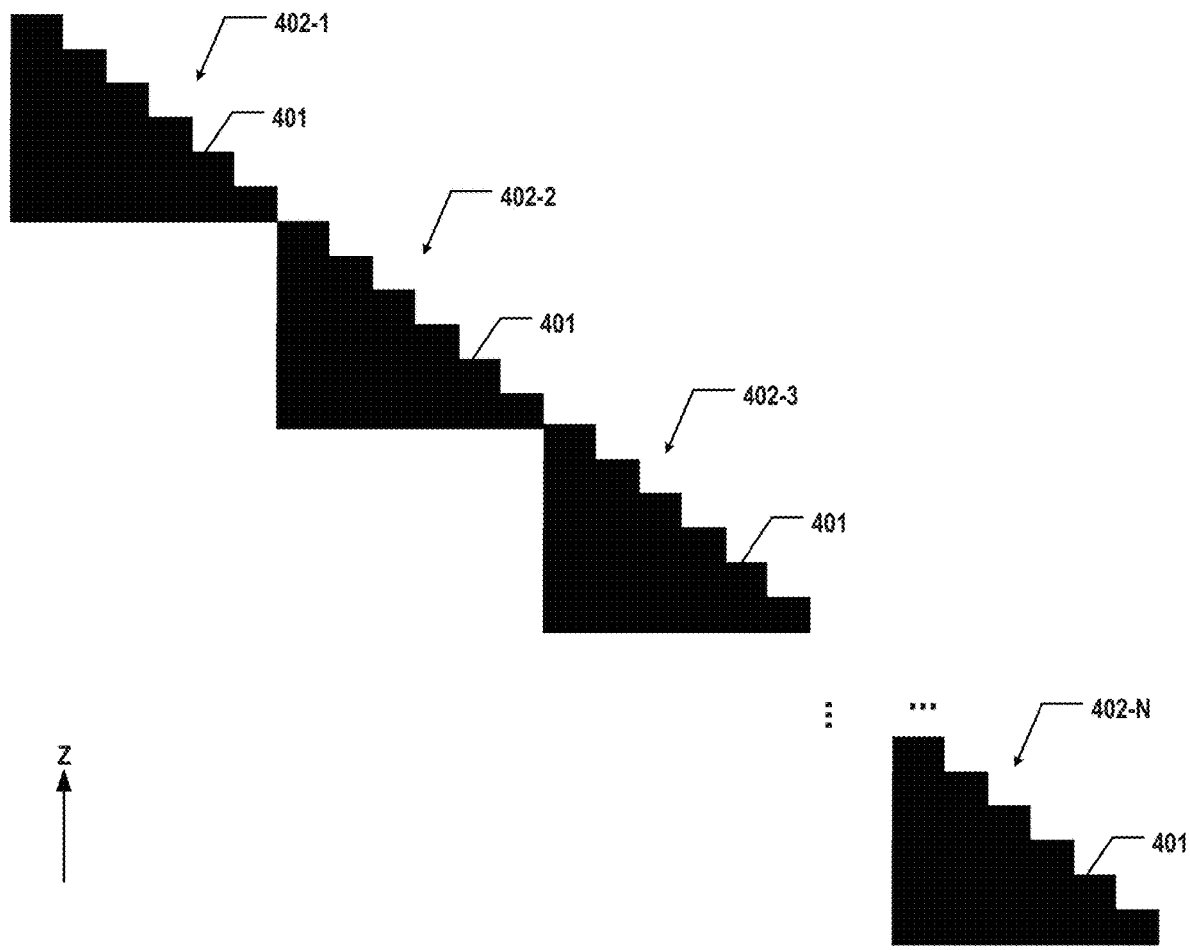
FIG. 4A illustrates an exemplary scheme of a plurality of concentric zones each including a plurality of stairs, according to some embodiments of the present disclosure.
Figure 4B:
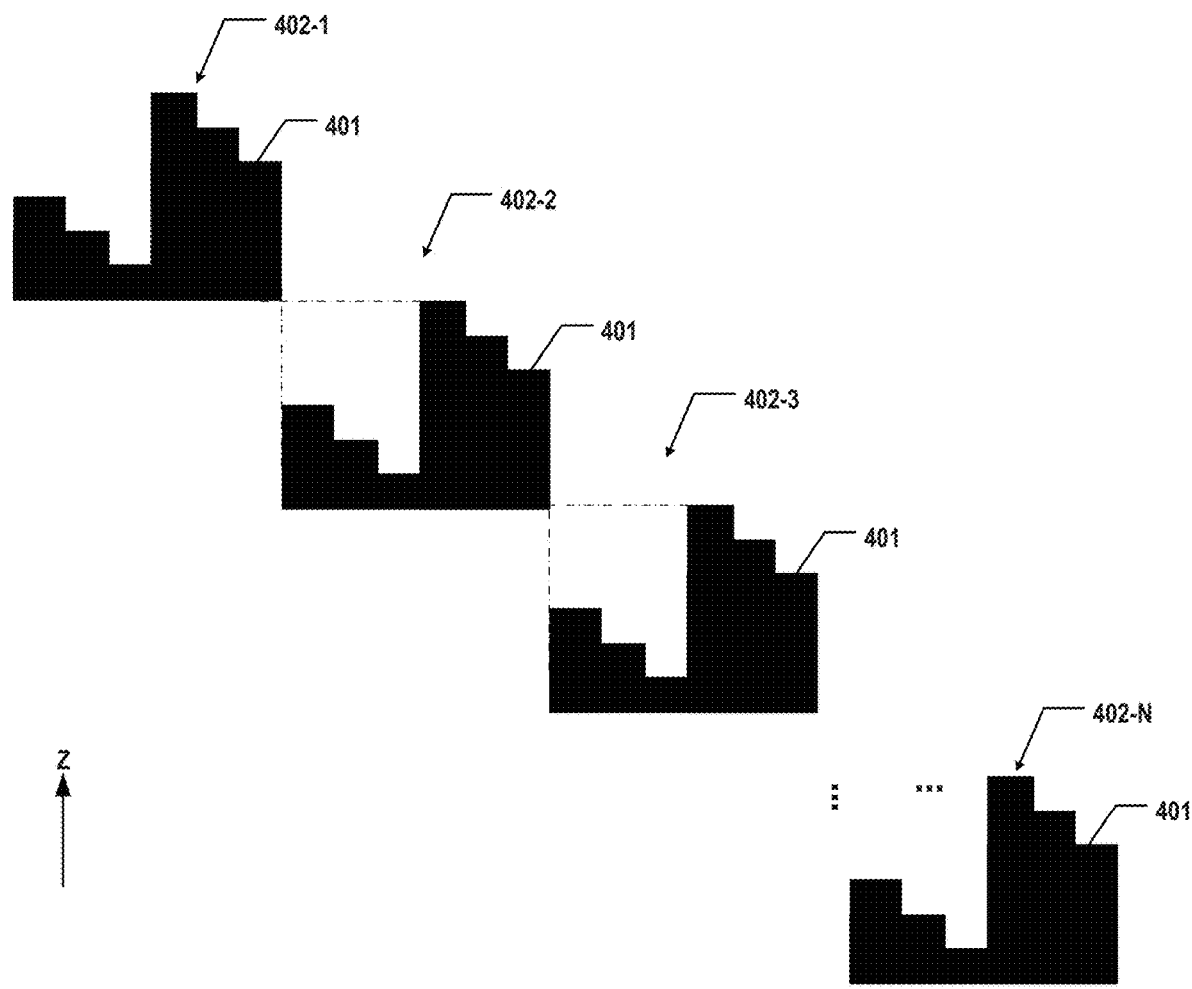
FIG. 4B illustrates another exemplary scheme of a plurality of concentric zones each including a plurality of stairs, according to some embodiments of the present disclosure.

It is understood that the scheme for arranging each stair 210 of concentric staircase structure 204 at different depths is not limited by the example of FIG. 2 and may include any suitable schemes in other examples. For example, FIGS. 4A and 4B each illustrate an exemplary scheme of a plurality of concentric zones each including a plurality of stairs 401 (e.g., one example of stairs 210 in FIG. 2), according to some embodiments of the present disclosure. In FIGS. 4A and 4B, each block 402 represents a respective concentric zone of a concentric staircase structure. For example, block 402-1 represents the top concentric zone (i.e., the concentric zone farthest away from the center of the concentric staircase structure), block 402-2 represents the next concentric zone below the top concentric zone, and block 402-*n* represents the bottom concentric zone (i.e., the concentric zone closest to the center). As shown in FIGS. 4A and 4B, stairs 401 in each concentric zone may be at different depths, and the concentric zones may be at different depths as well. As a result, each stair 401 of the concentric staircase structure may be at different depths.

It is understood that since one concentric zone may include multiple stairs 401, the depth of a concentric zone disclosed herein may be referenced to the depth of the same stair 401 in the z-direction (at the same relative level), such as the top stair, the middle stair, or the bottom stair. In one example, each concentric zone may be at different depths, e.g., the top stair of block 402-1 being higher than the top stair of block 402-2 in the z-direction. In some embodiments, concentric zones are not overlapped in the z-direction. That is, the bottom stair of the higher concentric zone is not lower than the top stair of the lower concentric zone in every pair of adjacent concentric zones, according to some embodiments. Although the depths of concentric zones may continuously change in the vertical direction, as shown in FIGS. 4A and 4B, the depths of stairs 401 in a concentric zone may continuously change in the tangential direction (e.g., FIG. 4A) or not (e.g., in FIG. 4B) based on different schemes as long as the depths of the stairs are different in the concentric zone. It is noted that FIGS. 4A and 4B do not show the cross-sections of a concentric staircase structure disclosed herein, but rather the schemes of multiple concentric zones 402 and stairs 401 in each concentric zone 402 in the tangential direction.

Figure 5:
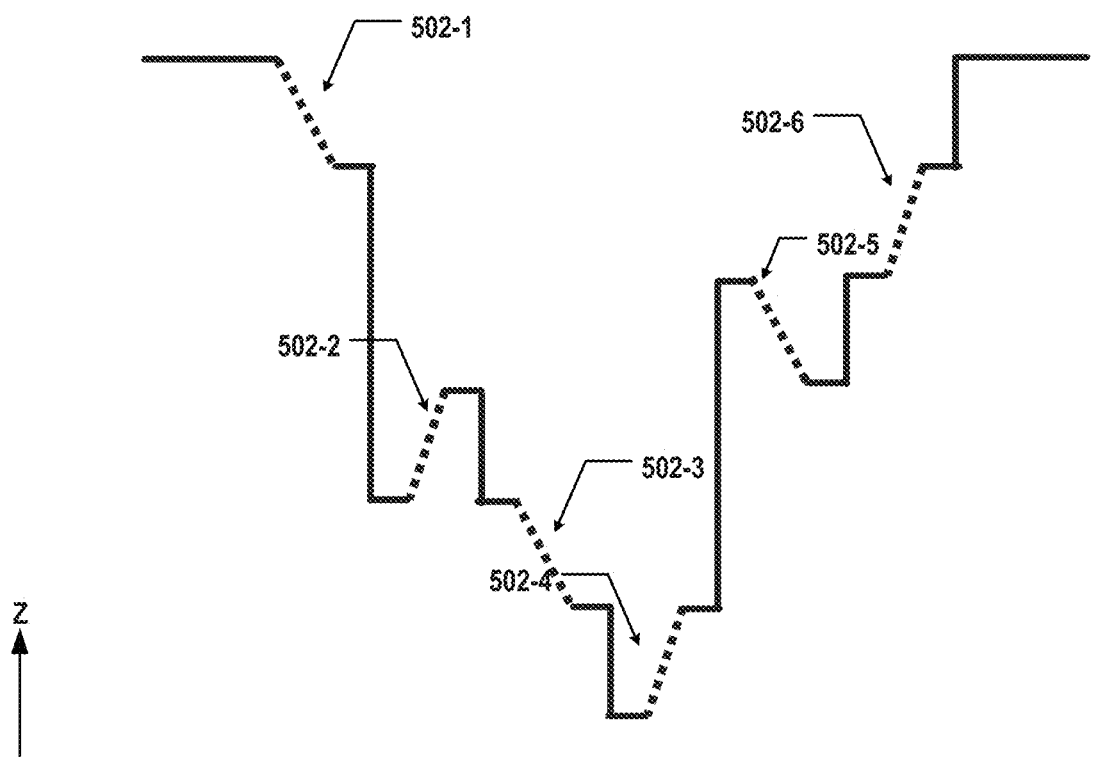
FIG. 5 illustrates an exemplary scheme of a plurality of sectors each including a plurality of stairs, according to some embodiments of the present disclosure.

FIG. 5 illustrates an exemplary scheme of a plurality of sectors each including a plurality of stairs, according to some embodiments of the present disclosure. In FIG. 5, each block 502 represents a respective sector, as opposed to a concentric zone, of a concentric staircase structure. For example, blocks 502-1, 502-2, 502-3, 502-4, 502-5, and 502-6 may represent six sectors (e.g., sectors 208 in FIG. 2) of a concentric staircase structure. As shown in FIG. 5, the stairs (represented by the dots) in each sector may be at different depths, and the sectors may be at different depths as well. As a result, each stair of the concentric staircase structure may be at different depths. It is understood that since one sector may include multiple stairs, the depth of a sector disclosed herein may be referenced to the depth of the same stair in the z-direction (at the same relative level), such as the top stair, the middle stair, or the bottom stair. In one example, each sector may be at different depths, e.g., the top stair of block 502-1 being higher than the top stairs of the rest block 502-2, 502-3, 502-4, 502-5, and 502-6 in the z-direction. In some embodiments, sectors are not overlapped in the z-direction. That is, the bottom stair of the sector is not lower than the top stair of the lower concentric sector in every pair of adjacent concentric zones in the vertical direction, according to some embodiments. Although the depths of the stairs in a sector may continuously change in the vertical direction as shown in FIG. 5, the depths of the sectors may continuously change in the tangential direction (not shown) or not (e.g., in FIG. 5) based on different schemes as long as the stairs of the sectors are different. It is noted that FIG. 5 does not show the cross-section of a concentric staircase structure disclosed herein, but rather the scheme of multiple sectors 502 in the tangential direction.

Figure 8:
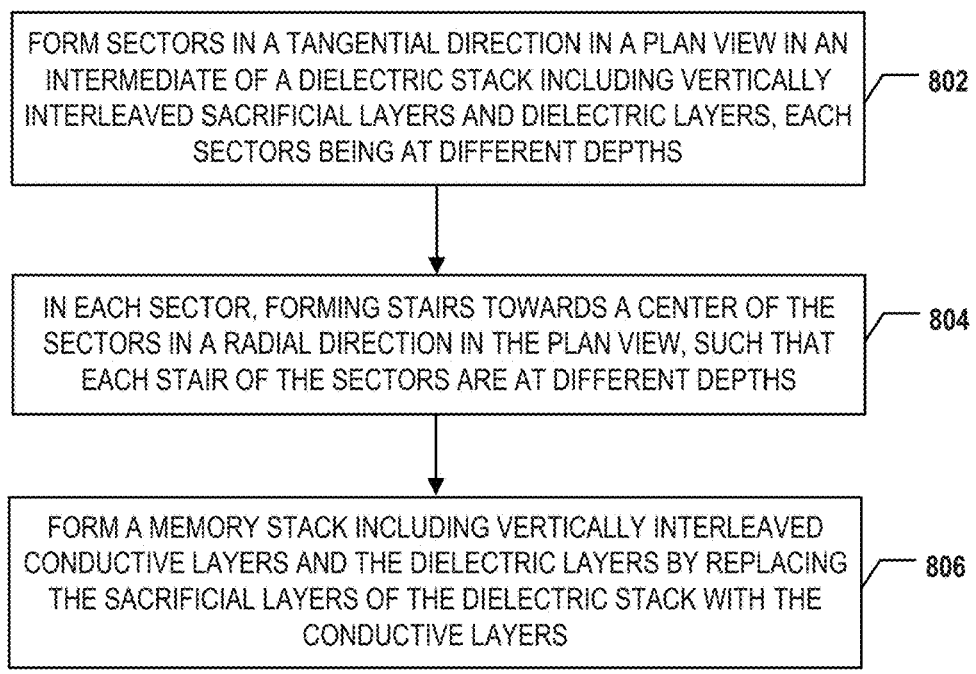
FIG. 8 is a flowchart of a method for forming an exemplary concentric staircase structure of a 3D memory device, according to some embodiments.
Figure 9:
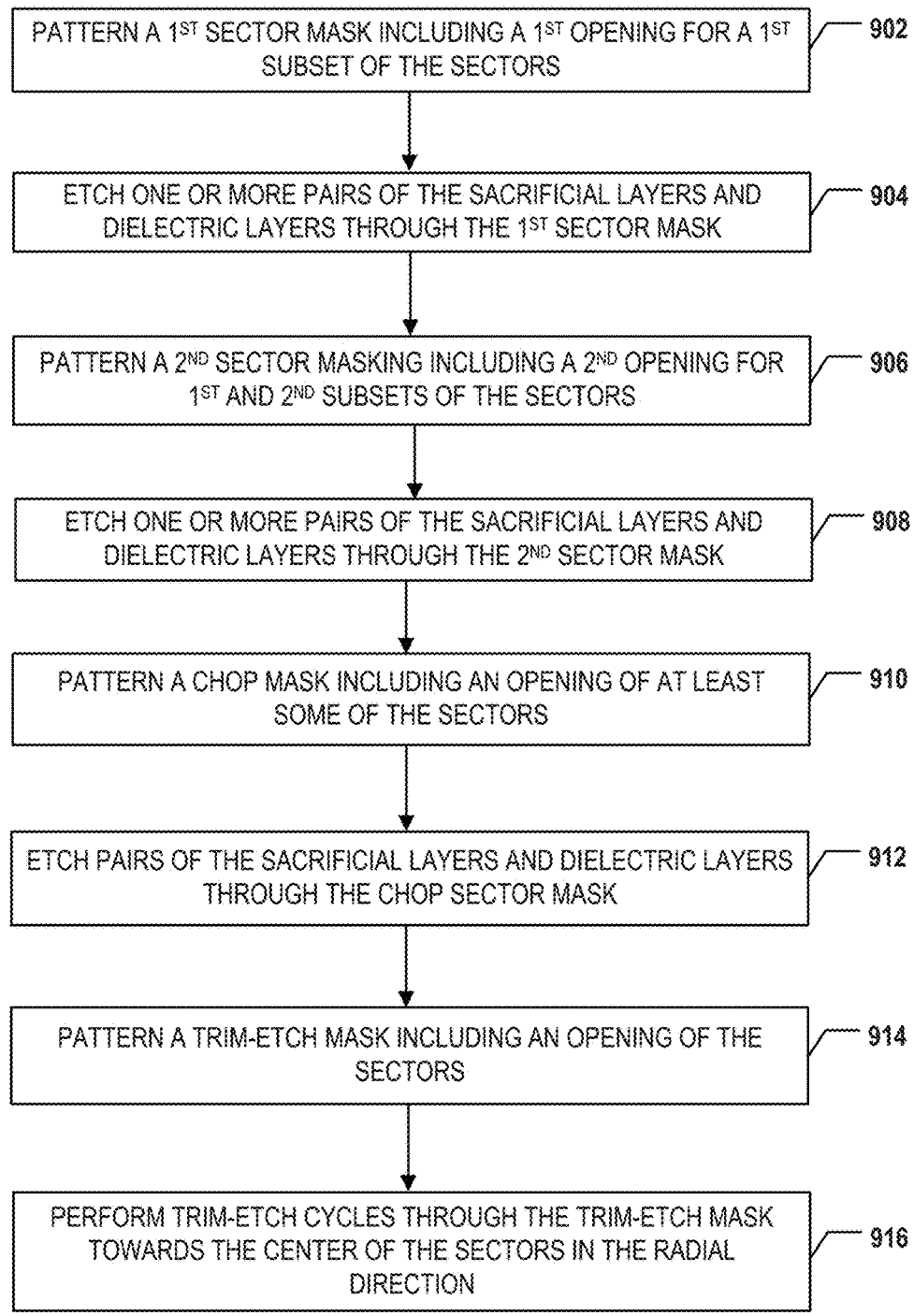
FIG. 9 is a flowchart of another method for forming an exemplary concentric staircase structure of a 3D memory device, according to some embodiments.

FIGS. 6A-6H illustrate a fabrication process for forming an exemplary concentric staircase structure of a 3D memory device, according to various embodiments of the present disclosure. FIG. 8 is a flowchart of a method 800 for forming an exemplary concentric staircase structure of a 3D memory device, according to some embodiments. FIG. 9 is a flowchart of another method 900 for forming an exemplary concentric staircase structure of a 3D memory device, according to some embodiments. Examples of the concentric staircase structures depicted in FIGS. 6A-6H, 8, and 9 include concentric staircase structure 204 depicted in FIG. 2. FIGS. 6A-6H, 8, and 9 will be described together. It is understood that the operations shown in methods 800 and 900 are not exhaustive and that other operations can be performed as well before, after, or between any of the illustrated operations. Further, some of the operations may be performed simultaneously, or in a different order than shown in FIGS. 8 and 9.

Referring to FIG. 8, method 800 starts at operation 802, in which a plurality of sectors are formed in a tangential direction in a plan view in an intermediate of a dielectric stack including vertically interleaved sacrificial layers and dielectric layers. Each of the plurality of sectors can be at different depths. To form the plurality of sectors, a plurality of subsets of the plurality of sectors are sequentially formed, each subset of the plurality of sectors being at the same depth, and at least some of the plurality of sectors are chopped, such that each sector is at different depths. Referring to FIG. 9, to sequentially form the plurality of subsets of the plurality of sectors, at operation 902, a first sector mask including a first opening for a first subset of the plurality of subsets of the sectors is partnered. At operation 904, one or more pairs of the sacrificial layers and dielectric layers are etched through the first sector mask. At operation 906, a second sector mask including a second opening for a second subset and the first subset of the plurality of subsets of the sectors is patterned. At operation 908, one or more pairs of the sacrificial layers and dielectric layers are etched through the second sector mask. In some embodiments, each subset of the sectors includes a pair of symmetric sectors with respect to the center of the sectors.

Figure 6A:
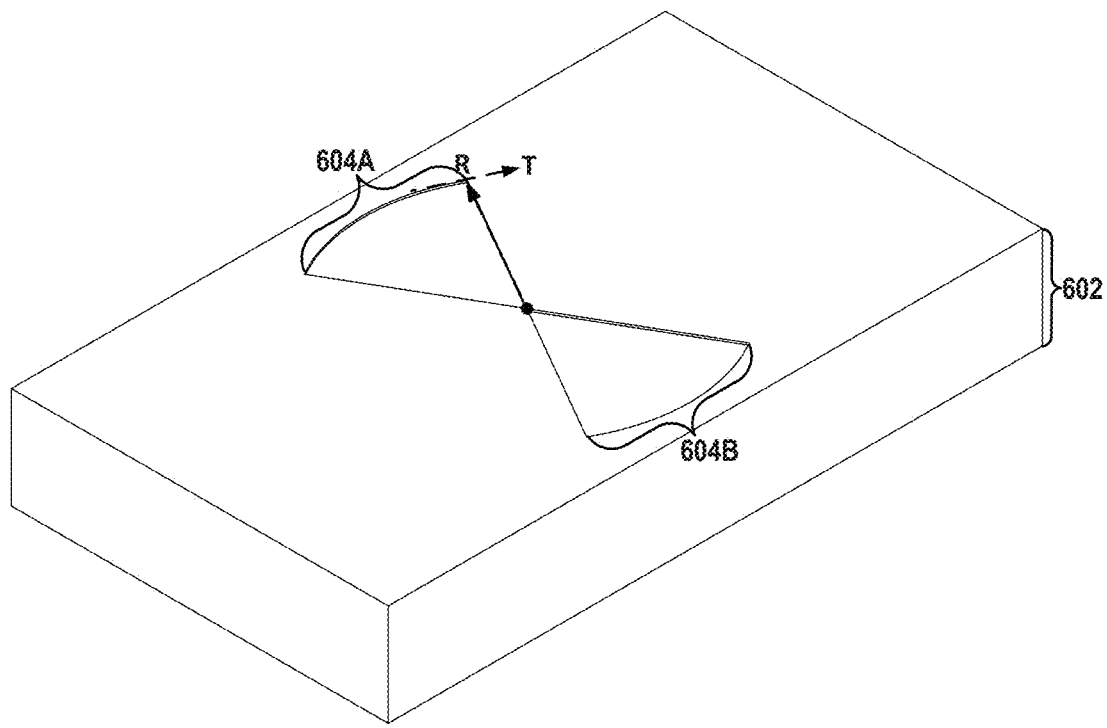
FIGS. 6A-6H illustrate a fabrication process for forming an exemplary concentric staircase structure of a 3D memory device, according to various embodiments of the present disclosure.
Figure 6A:
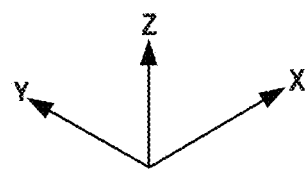

Referring to FIG. 6A, a dielectric stack 602 including a plurality pairs of a first dielectric layer (also known as a "sacrificial layer," not shown) and a second dielectric layer (together referred to herein as "dielectric layer pairs," not shown) is formed above a silicon substrate (not shown). That is, dielectric stack 602 includes vertically interleaved sacrificial layers and dielectric layers, according to some embodiments. The dielectric layers and sacrificial layers can be alternatingly deposited on the silicon substrate to form dielectric stack 602. In some embodiments, each dielectric layer includes a layer of silicon oxide, and each sacrificial layer includes a layer of silicon nitride. Dielectric stack 602 can be formed by one or more thin film deposition processes including, but not limited to, chemical vapor deposition (CVD), physical vapor deposition (PVD), atomic layer deposition (ALD), or any combination thereof.

Referring to FIG. 6A, a first pair of symmetric sectors 604A and 604B with respect to the center of sectors 604A and 604B are formed in the intermediate of dielectric stack 602. The thickness of each sector 604A or 604B can be the thickness of one dielectric layer pair, according to some embodiments. It is understood that in some examples, the thickness of each sector 604A or 604B may be N times of the thickness of one dielectric layer pair, where N is a positive integer greater than 1. To form the first pair of symmetric sectors 604A and 604B, a first sector mask (not shown) including a first opening for the first pair of symmetric sectors 604A and 604B can be patterned first on dielectric stack 602. The first sector mask can be a hard etch mask or a soft etch mask (e.g., a photoresist mask). In case the first sector mask is a hard etch mask, the first sector mask can be made of, for example, polysilicon, high dielectric constant (high-k) dielectrics, titanium nitride (TiN), or any other suitable hard mask materials. The first sector mask can be formed by first depositing a hard mask material layer on dielectric stack 602 using one or more thin film deposition processes including, but not limited to, CVD, PVD, ALD, electroplating, electroless plating, or any combination thereof. The hard mask material layer then can be patterned to form openings matching the first pair of symmetric sectors 604A and 604B using lithography and dry etch and/or wet etch processes, such as reactive ion etch (RIE). In case the first sector mask is a soft mask, the first sector mask can be formed by coating a photoresist layer on dielectric stack 602 using spin coating and patterning the coated photoresist layer using lithography and development processes.

The parts of dielectric stack 602 uncovered by the first sector mask can be etched by a first depth (e.g., the thickness of one dielectric layer pair) using wet etch and/or dry etch processes. Any suitable etchants (e.g., of wet etching and/or dry etching) can be used to remove a certain thickness (e.g., the thickness of one dielectric layer pair) of dielectric stack 602 in the exposed portions through the first sector mask. The etched thickness (e.g., the first depth) can be controlled by etch rate and/or etch time. In some embodiments, the first depth is nominally the same as the thickness of one dielectric layer pair. It is understood that in some examples, the first depth is multiple times of the thickness of one dielectric layer pair.

Figure 6B:
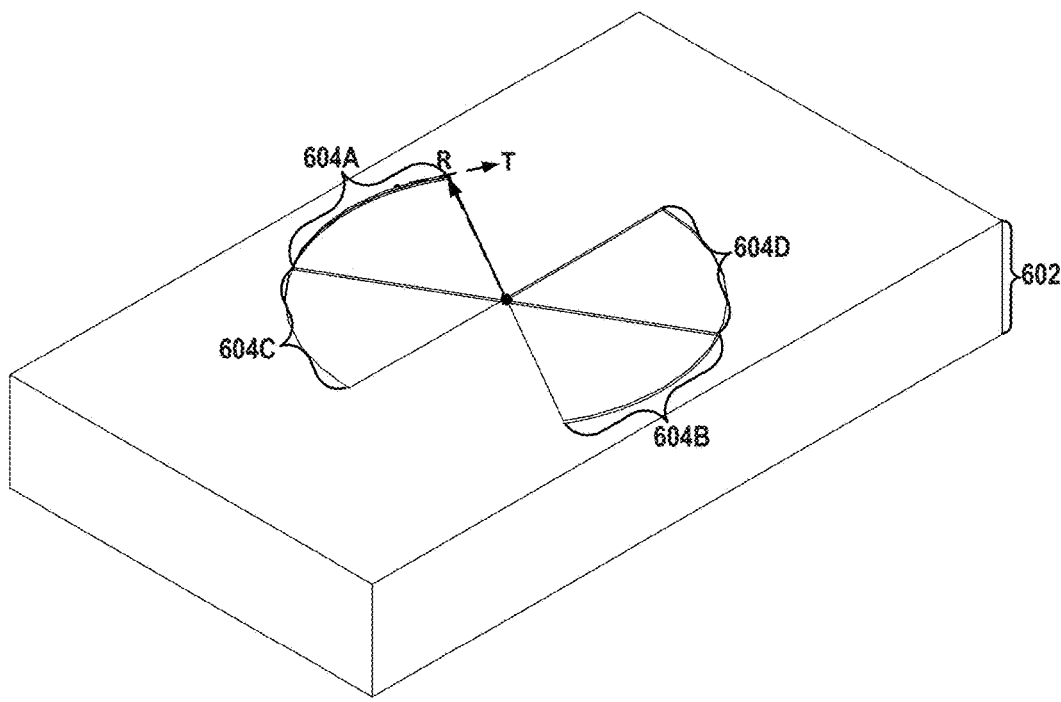
Figure 6B:
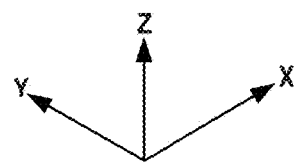

As illustrated in FIG. 6B, a second pair of symmetric sectors 604C and 604D with respect to the common center of sectors 604A, 604B, 604C, and 604D are formed in the intermediate of dielectric stack 602 as well. The thickness of each new sector 604C or 604D can be the thickness of one dielectric layer pair, according to some embodiments. The thickness of each existing sector 604A or 604B can be increased from the thickness of one dielectric layer pair to the thickness of two dielectric layer pairs. That is, when forming the second pair of symmetric sectors 604C and 604D, the thickness of the first pair of symmetric sectors 604A and 604B can be increased as well by the same etching process.

To form the second pair of symmetric sectors 604C and 604D, a second sector mask (not shown) including a second opening for both the first and second pairs of symmetric sectors 604A and 604B, and 604C and 604D can be patterned on dielectric stack 602. The second sector mask can be a hard etch mask or a soft etch mask. In case the second sector mask is a hard etch mask, the second sector mask can be made of, for example, polysilicon, high-k dielectrics, TiN, or any other suitable hard mask materials. The second sector mask can be formed by first depositing a hard mask material layer on dielectric stack 602 using one or more thin film deposition processes including, but not limited to, CVD, PVD, ALD, electroplating, electroless plating, or any combination thereof. The hard mask material layer then can be patterned to form openings matching both the first and second pairs of symmetric sectors 604A and 604B, and 604C and 604D using lithography and dry etch and/or wet etch processes, such as RIE. In case the second sector mask is a soft mask, the second sector mask can be formed by coating a photoresist layer on dielectric stack 602 using spin coating and patterning the coated photoresist layer using lithography and development processes.

The parts of dielectric stack 602 uncovered by the second sector mask can be etched by a second depth (e.g., the thickness of one dielectric layer pair) using wet etch and/or dry etch processes. Any suitable etchants (e.g., of wet etching and/or dry etching) can be used to remove a certain thickness (e.g., the thickness of one dielectric layer pair) of dielectric stack 602 in the exposed portions through the second sector mask. The etched thickness (e.g., the second depth) can be controlled by etch rate and/or etch time. In some embodiments, the second depth is nominally the same as the thickness of one dielectric layer pair. As a result, the second pair of symmetric sectors 604C and 604D each having a thickness of the second depth (e.g., the thickness of one dielectric layer pair) can be formed. Moreover, as the first pair of symmetric sectors 604A and 604B are etched again through the second sector mask when etching the second pair of symmetric sectors 604C and 604D, the thickness of the first pair of symmetric sectors 604A and 604B is increased from the first depth to the first and second depths (e.g., the thickness of two dielectric layer pairs), according to some embodiments.

Figure 6C:
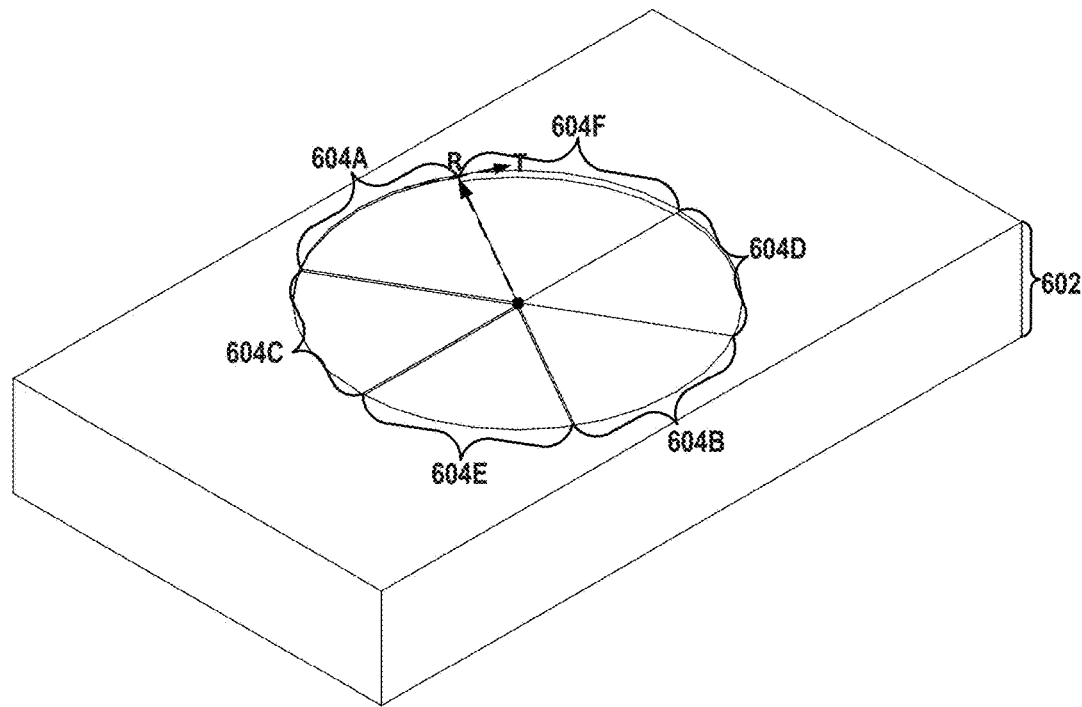
Figure 6C:
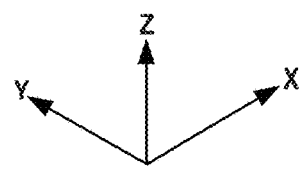

As illustrated in FIG. 6C, a third pair of symmetric sectors 604E and 604F with respect to the common center of sectors 604A, 604B, 604C, 604D, 604E, and 604F are formed in the intermediate of dielectric stack 602 as well. That is, sectors 604A, 604B, 604C, 604D, 604E, and 604F adjacent to one another in the tangential direction in the plan view are formed. The thickness of each new sector 604E or 604F can be the thickness of one dielectric layer pair, according to some embodiments. The thickness of each existing sector 604A or 604B can be increased from the thickness of two dielectric layer pairs to the thickness of three dielectric layer pairs, and the thickness of each existing sector 604C or 604D can be increased from the thickness of one dielectric layer pair to the thickness of two dielectric layer pairs. That is, when forming the third pair of symmetric sectors 604E and 604F, the thickness of both the first and second pairs of symmetric sectors 604A and 604B, and 604C and 604D can be increased as well by the same etching process. As a result, different pairs of sectors can have different thicknesses.

To form the third pair of symmetric sectors 604E and 604F, a third sector mask (not shown) including a third opening for the first, second, and third pairs of symmetric sectors 604A and 604B, 604C and 604D, and 604E and 604F can be patterned on dielectric stack 602. The third sector mask can be a hard etch mask or a soft etch mask. In case the third sector mask is a hard etch mask, the third sector mask can be made of, for example, polysilicon, high-k dielectrics, TiN, or any other suitable hard mask materials. The third sector mask can be formed by first depositing a hard mask material layer on dielectric stack 602 using one or more thin film deposition processes including, but not limited to, CVD, PVD, ALD, electroplating, electroless plating, or any combination thereof. The hard mask material layer then can be patterned to form openings matching the first, second, and third pairs of symmetric sectors 604A and 604B, 604C and 604D, and 604E and 604F using lithography and dry etch and/or wet etch processes, such as RIE. In case the third sector mask is a soft mask, the third sector mask can be formed by coating a photoresist layer on dielectric stack 602 using spin coating and patterning the coated photoresist layer using lithography and development processes.

The parts of dielectric stack 602 uncovered by the third sector mask can be etched by a third depth (e.g., the thickness of one dielectric layer pair) using wet etch and/or dry etch processes. Any suitable etchants (e.g., of wet etching and/or dry etching) can be used to remove a certain thickness (e.g., the thickness of one dielectric layer pair) of dielectric stack 602 in the exposed portions through the third sector mask. The etched thickness (e.g., the third depth) can be controlled by etch rate and/or etch time. In some embodiments, the third depth is nominally the same as the thickness of one dielectric layer pair. As a result, the third pair of symmetric sectors 604E and 604F each having a thickness of the third depth (e.g., the thickness of one dielectric layer pair) can be formed. Moreover, as both the first and second pairs of symmetric sectors 604A and 604B, and 604C and 604D are etched again through the third sector mask when etching the third pair of symmetric sectors 604E and 604F, the thickness of the first pair of symmetric sectors 604A and 604B is increased from the first and second depths to the first, second, and third depths (e.g., the thickness of three dielectric layer pairs), and the thickness of the second pair of symmetric sectors 604C and 604D is increased from the first depth to the first and second depths (e.g., the thickness of two dielectric layer pairs), according to some embodiments. It is understood that the number of the patterning and etching processes may vary in other examples, e.g., more or less than three times, depending on the number of sectors to be formed. Nevertheless, a plurality of subsets of sectors (e.g., pairs of symmetric sectors) can be sequentially formed using the repeated patterning and etching processes described above with respect to FIGS. 6A-6C.

Referring to FIG. 9, to chop the at least some of the plurality of sectors, at operation 910, a chop mask including an opening of the at least some of the plurality of sectors is patterned. At operation 912, a plurality of pairs of the sacrificial layers and dielectric layers are etched through the chop mask.

Figure 6D:
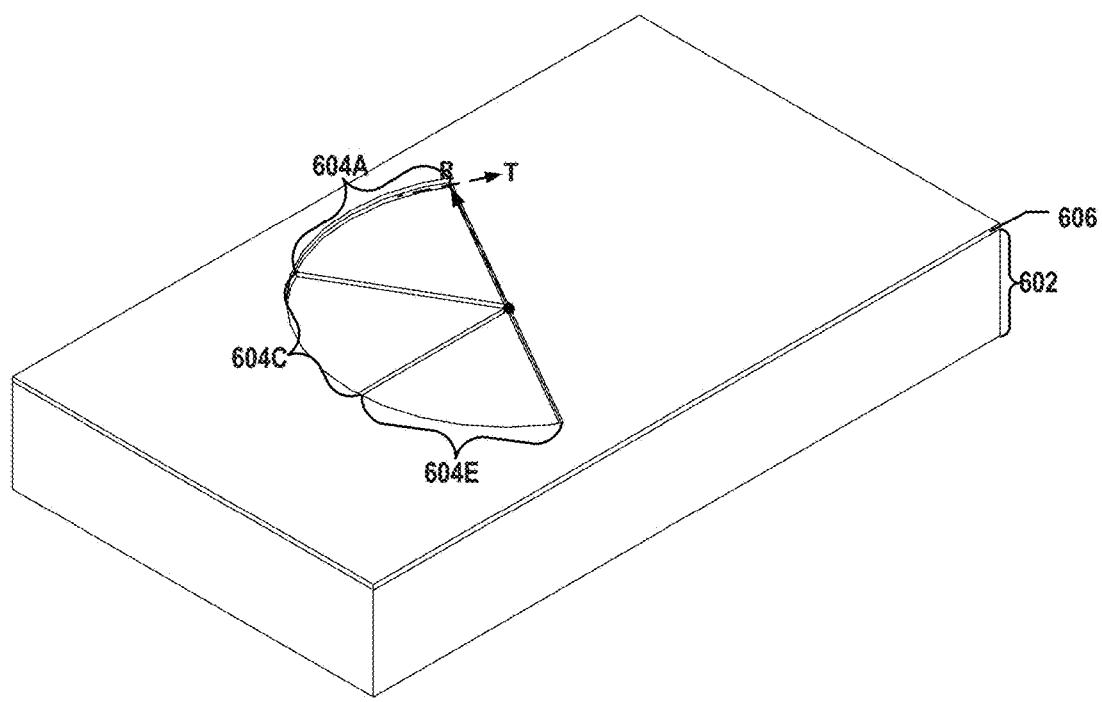
Figure 6D:
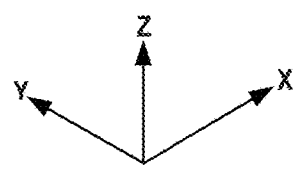

As illustrated in FIG. 6D, a chop mask 606 including an opening of sectors 604A, 604C, and 604E is patterned. Chop mask 606 can be a hard etch mask or a soft etch mask. In case the chop mask is a hard etch mask, chop mask 606 can be made of, for example, polysilicon, high-k dielectrics, TiN, or any other suitable hard mask materials. Chop mask 606 can be formed by first depositing a hard mask material layer on dielectric stack 602 using one or more thin film deposition processes including, but not limited to, CVD, PVD, ALD, electroplating, electroless plating, or any combination thereof. The hard mask material layer then can be patterned to form openings matching sectors 604A, 604C, and 604E using lithography and dry etch and/or wet etch processes, such as RIE. In case that chop mask 606 is a soft mask, chop mask 606 can be formed by coating a photoresist layer on dielectric stack 602 using spin coating and patterning the coated photoresist layer using lithography and development processes.

The opening of chop mask 606 can be so designed such that after the chopping, each sector 604A, 604B, 604C, 604D, 604E, and 604F can be at different depths, i.e., having different thickness. Since each pair of symmetric sectors 604A and 604B, 604C and 604D, or 604E and 604F have the same thickness before chopping, in some embodiments, the opening is so designed such that it matches one sector from each air of symmetric sectors 604A and 604B, 604C and 604D, or 604E and 604F. It is understood that the design of chop mask 606 may vary in other examples and is not limited by the example of FIG. 6D.

Figure 6E:
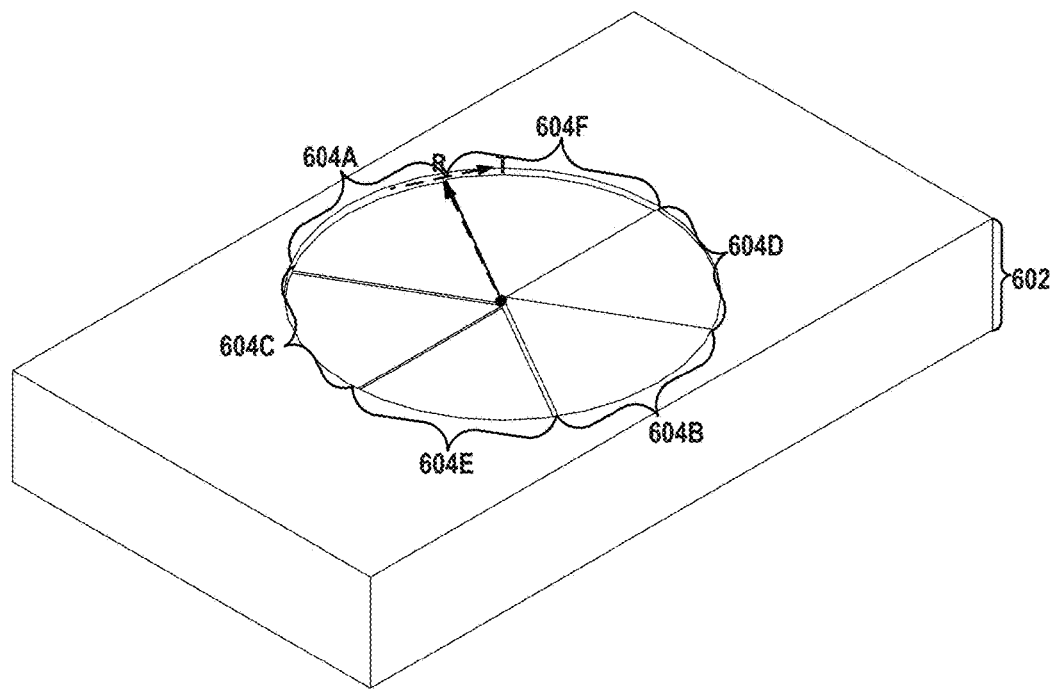
Figure 6E:
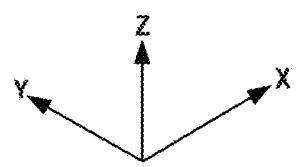
Figure 7:
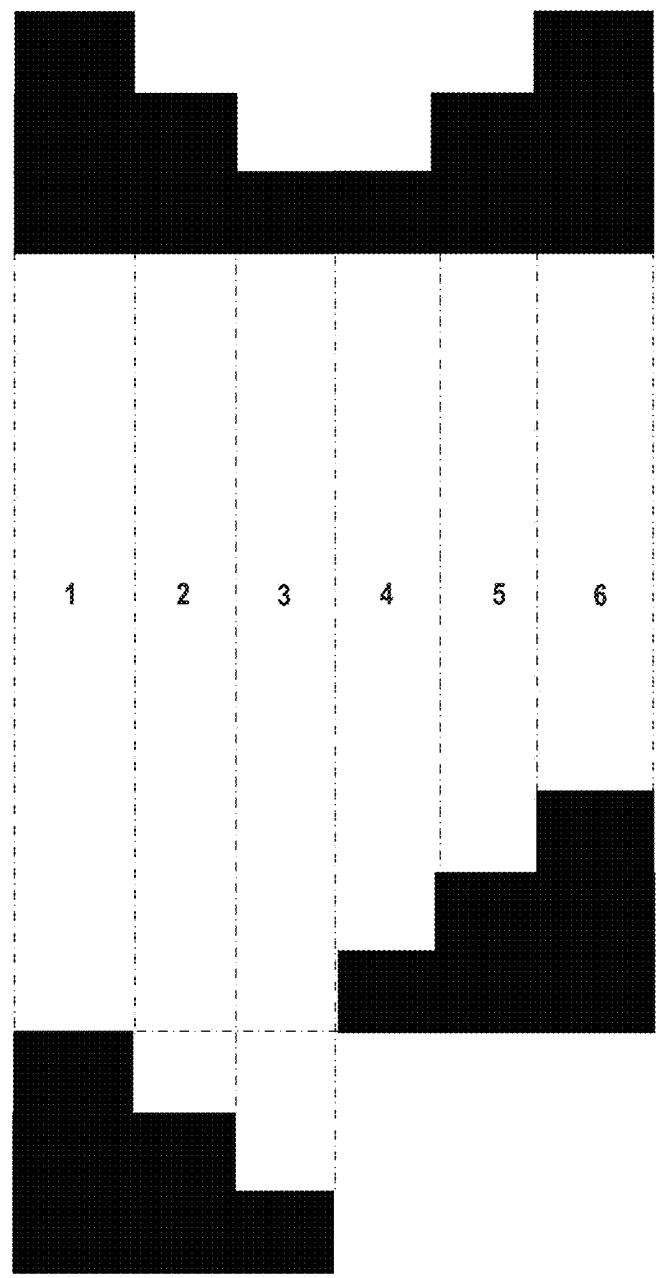
FIG. 7 illustrates an exemplary scheme of chopping a plurality of sectors to different depths in forming a concentric staircase structure, according to some embodiments of the present disclosure.

As illustrated in FIG. 6E, sectors 604A, 604C, and 604E that are exposed from the opening of chop mask 606 (shown in FIG. 6D) are chopped, such that 604A, 604B, 604C 604D, 604E, and 604F are at different depths after the chopping. As used herein, a "chopping" process is a process that reduces the depth (increases the thickness) of one or more sectors by a plurality of etching cycles. Each etch cycle can include one or more dry etch and/or wet etch processes that etch one dielectric pair, i.e., increasing the thickness by one dielectric pair. As described above in detail, the purpose of the chopping process is to make each 604A, 604B, 604C 604D, 604E, or 604F at different depths, according to some embodiments. Accordingly, depending on the number of sectors, a certain number of chopping processes may be needed. For example, as shown in FIG. 7, sectors 1 and 6 may be at the same depth, sectors 2 and 5 may be at the same depth, and sectors 3 and 4 may be at the same depth. By chopping sectors 1, 2, and 3 by a chopping depth (e.g., the thickness of three dielectric pairs), each sector 1, 2, 3, 4, 5, or 6 may be at different depths.

It is understood that chop mask 606 and the chopping process described above are one example for chopping sectors 604A, 604B, 604C 604D, 604E, and 604F, and any other suitable chopping schemes (including various chop masks and chopping processes) may be used to achieve the same result. The number of chop masks, the sequence of the chop masks, the design (e.g., the number and pattern of openings) of each chop mask, and/or the reduced depth by each chopping process (e.g., the number of etching cycles) may affect the specific depth of each sector after the chopping process albeit the sectors are at different depths.

Method 800 then proceeds to operation 804 in FIG. 8, in which in each of the plurality of sectors, a plurality of stairs are formed towards a center of the plurality of sectors in a radial direction in the plan view, such that each stair of the plurality of sectors is at different depths. Referring to FIG. 9, to form the plurality of stairs, at operation 914, a trim-etch mask including an opening of part of the plurality of sectors is patterned. At operation 916, a plurality of trim-etch cycles are performed through the trim-etch mask towards the center of the plurality of sectors in the radial direction. In some embodiments, a concentric zone including a plurality of stairs in a tangential direction in the plan view is formed by each of the plurality of trim-etch cycles.

Figure 6F:
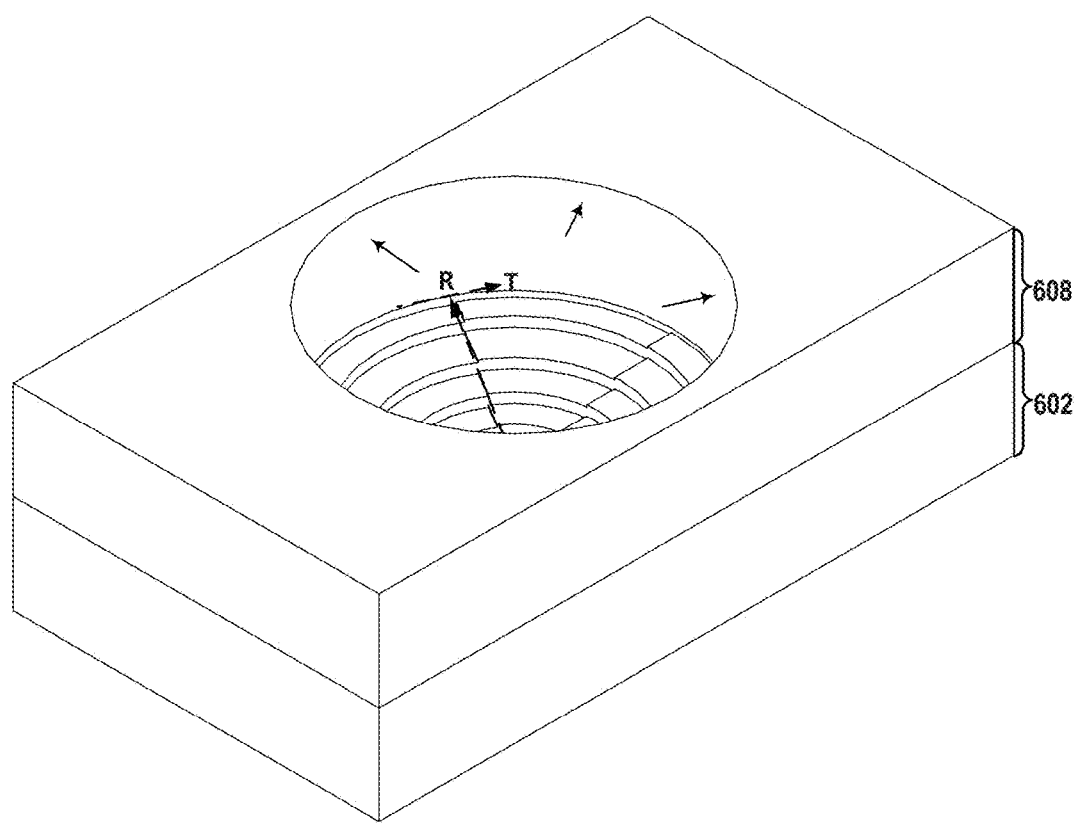
Figure 6F:
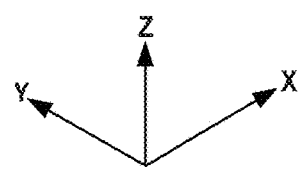

As illustrated in FIG. 6F, a trim-etch mask 608 is patterned on dielectric stack 602. Trim-etch mask 608 can include an opening that matches and expose part of sectors 604A, 604B, 604C 604D, 604E, and 604F, e.g., the bottom concentric zone closest to the center. In some embodiments, trim-etch mask 608 is a soft mask (e.g., a photoresist mask), which can be trimmed in the trim-etch process for forming the stairs in the radial direction. In some embodiments, trim-etch mask 608 is formed by coating a photoresist layer on dielectric stack 602 using spin coating and patterning the coated photoresist layer using lithography and development processes. Trim-etch mask 608 can be used as an etch mask to etch the exposed portions of dielectric stack 602. During the trim-etch process, trim-etch mask 608 can be trimmed (e.g., etched incrementally and outwardly as indicated by the arrows), such that the opening of trim-etch mask 608 can be incrementally enlarged in the radial direction by each trim process. FIG. 6F illustrates the boundary of the trimmed photoresist layers (e.g., along the edge of the opening) covering underneath dielectric stack 602 at the end of the trim-etch processes when sectors 604A, 604B, 604C 604D, 604E, and 604F are fully exposed by the opening of trim-etch mask 608. The opening can be trimmed in the radial direction from the center because of its circular shape.

In some embodiments, the amount of the photoresist layer trimmed from trim-etch mask 608 can be controlled by trim rate and/or trim time and can be directly relevant (e.g., determinant) to the dimensions of the resulting stairs. The trim of trim-etch mask 608 can be performed using any suitable etching process, e.g., isotropic dry etching or wet etching. The trim of trim-etch mask 608 can cause the part of dielectric stack 602 uncovered by trim-etch mask 608 to be enlarged. The enlarged uncovered portions of dielectric stack 602 can be etched again using the trimmed trim-etch mask 608 as the second etch mask to form more stairs at different depths in each concentric zone formed after each trim-etch process. Any suitable etchants (e.g., wet etching and/or dry etching) can be used to remove a certain thickness (e.g., the stair height) of dielectric stack 602 in the enlarged exposed portions. The etched thickness (e.g., the stair height) can be controlled by etch rate and/or etch time. In some embodiments, the etched thickness is nominally the same as the etched thickness in the previous etching step. As a result, the height of each stair is nominally the same. It is understood that in some embodiments, the etched thicknesses are different in different etching steps such that the heights of stairs are different in different concentric zones. The trim process of a photoresist mask followed by the etching process of a stack structure (e.g., dielectric stack 602) is referred to herein as a trim-etch cycle. The number of trim-etch cycles can determine the number of concentric zones and the number of stairs formed according to trim-etch mask 608.

Figure 6G:
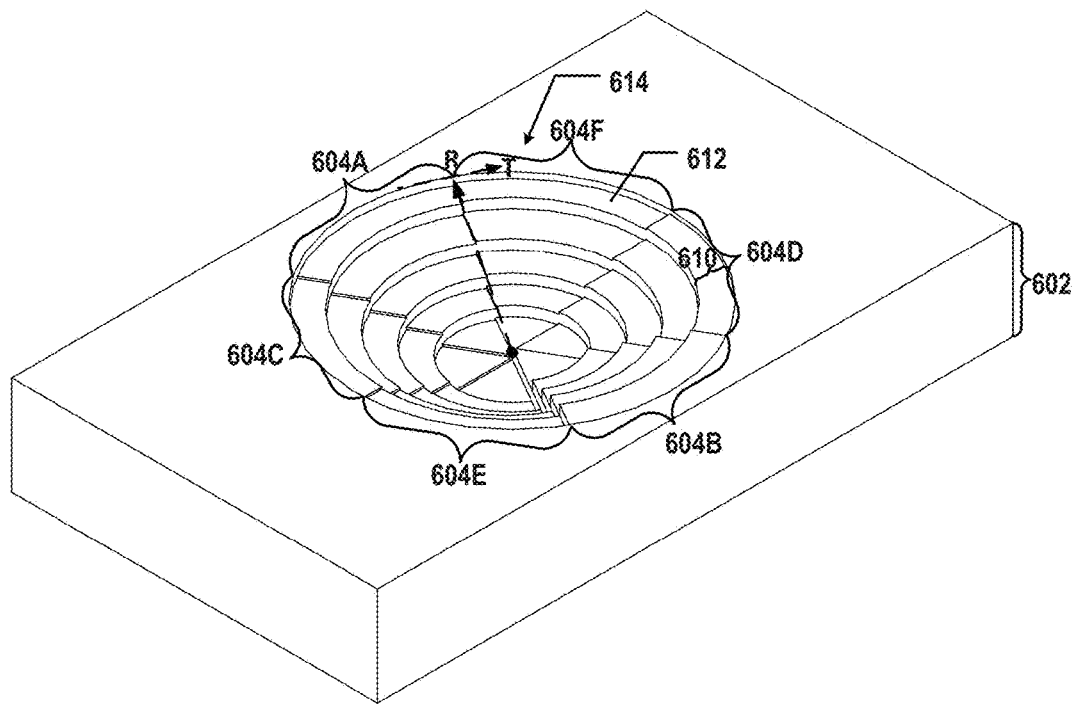
Figure 6G:
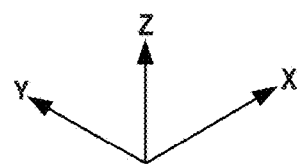

As illustrated in FIG. 6G, after each trim-etch cycle, a concentric zone 610 at a different depth can be formed in the radial direction away from the center. The lateral dimension of concentric zone 610 can be determined by the amount of photoresist layer trimmed from trim-etch mask 608 by the respective trim process. The depths of all existing concentric zone 610 can be changed by each new trim-etch cycle, such that each concentric zone 610 can be at different depths after the trim-etch processes. Since sectors 604A, 604B, 604C 604D, 604E, and 604F are at different depths as well, concentric zones 610 in the radial direction and sectors 604A, 604B, 604C 604D, 604E, and 604F in the tangential direction can together define a plurality of stairs 612 towards the center at different depths after the trim-etch processes. In other words, in each sectors 604A, 604B, 604C 604D, 604E, or 604F, the same number of stairs (determined by the number of concentric zones 610) can be formed towards the center of sectors 604A, 604B, 604C 604D, 604E, and 604F in the radial direction by the trim-etch processes. A concentric staircase structure 614 including a plurality of stairs 612 in concentric zones 610 and sectors 604A, 604B, 604C 604D, 604E, and 604F is thereby formed as shown in FIG. 6G, according to some embodiments.

Figure 6H:
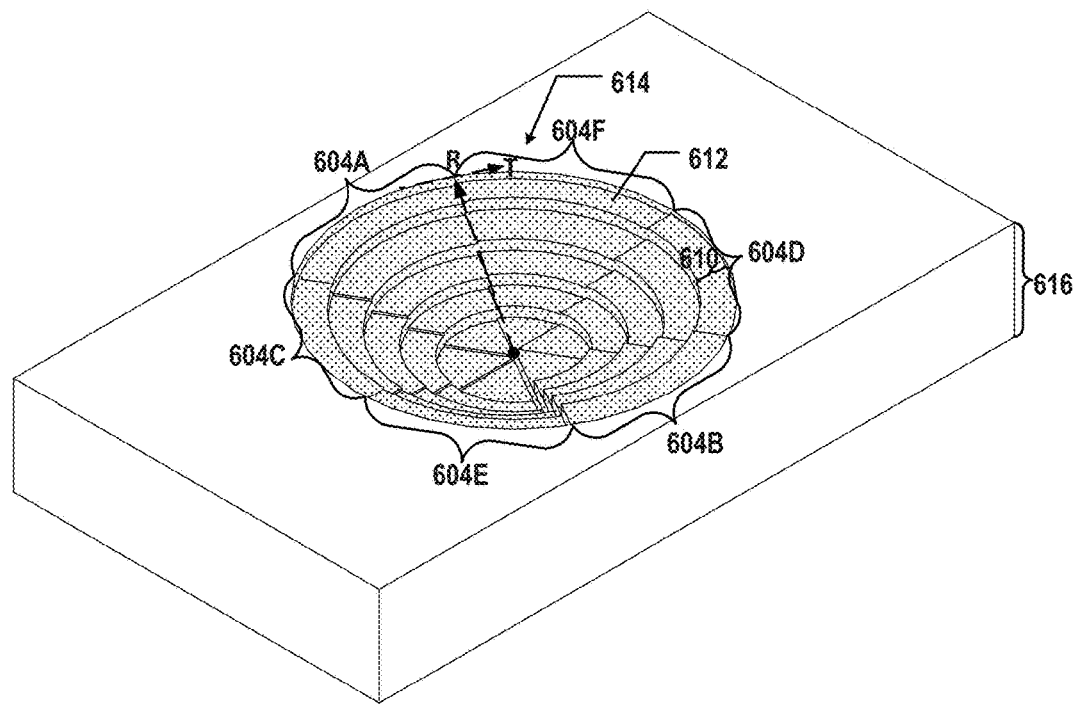
Figure 6H:
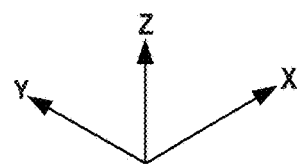

Method 800 then proceeds to operation 806 in FIG. 8, in which a memory stack including vertically interleaved conductive layers and the dielectric layers by replacing the sacrificial layers of the dielectric stack with the conductive layers. As shown in FIG. 6H, a memory stack 616 is formed using a so-called gate replacement process, such that concentric staircase structure 614 is formed in the intermediate of memory stack 616. Memory stack 616 can include vertically interleaved conductive layers and the dielectric layers. In some embodiments, the sacrificial layers in dielectric stack 602 (shown in FIG. 6G) are removed, for example, using wet etching by applying etchant through slit openings extending vertically through dielectric stack 602. The resulting recesses can then be filled with the conductive layers, for example, by depositing conductive materials through the slit openings using one or more thin film deposition processes including, but not limited to, CVD, PVD, ALD, or any combination thereof. As a result, memory stack 616 can be formed to replace dielectric stack 602.

According to one aspect of the present disclosure, a 3D memory device includes a memory array structure and a concentric staircase structure in an intermediate of the memory array structure. The concentric staircase structure includes a plurality of concentric zones in a radial direction in a plan view. Each of the plurality of concentric zones includes a plurality of stairs in a tangential direction in the plan view.

In some embodiments, the plurality of stairs in each of the plurality of concentric zones are at different depths.

In some embodiments, the plurality of stairs in each of the plurality of concentric zones have a nominally same lateral dimension.

In some embodiments, the plurality of concentric zones are at different depths.

In some embodiments, the concentric staircase structure further includes a plurality of sectors in the tangential direction, and each of the plurality of sectors includes a plurality of stairs in the radial direction.

In some embodiments, the plurality of stairs in each of the plurality of sectors are at different depths.

In some embodiments, the plurality of stairs in each of the plurality of sectors have different lateral dimensions.

In some embodiments, the plurality of sectors are at different depths.

In some embodiments, each stair of the concentric staircase structure is at different depths.

In some embodiments, the concentric staircase structure has a concentric circles layout.

In some embodiments, the memory array structure includes vertically interleaved conductive layers and dielectric layers, and a height of each stair is equal to a total thickness of one or more pairs of the conductive layers and dielectric layers.

According to another aspect of the present disclosure, a 3D memory device includes a memory array structure and a concentric staircase structure in an intermediate of the memory array structure. The concentric staircase structure includes a plurality of sectors in a tangential direction in a plan view. Each of the plurality of sectors includes a plurality of stairs in a radial direction in the plan view.

In some embodiments, the plurality of stairs in each of the plurality of sectors are at different depths.

In some embodiments, the plurality of stairs in each of the plurality of sectors have different lateral dimensions.

In some embodiments, the plurality of sectors are at different depths.

In some embodiments, the concentric staircase structure further includes a plurality of concentric zones in the radial direction, and each of the plurality of concentric zones includes a plurality of stairs in the tangential direction.

In some embodiments, the plurality of stairs in each of the plurality of concentric zones are at different depths.

In some embodiments, the plurality of stairs in each of the plurality of concentric zones have a nominally same lateral dimension.

In some embodiments, the plurality of concentric zones are at different depths.

In some embodiments, each stair of the concentric staircase structure is at different depths.

In some embodiments, the concentric staircase structure has a concentric circles layout.

In some embodiments, the memory array structure includes vertically interleaved conductive layers and dielectric layers, and a height of each stair is equal to a total thickness of one or more pairs of the conductive layers and dielectric layers.

According to still another aspect of the present disclosure, a method for forming a concentric staircase structure of a 3D memory device is disclosed. A plurality of sectors are formed in a tangential direction in a plan view in an intermediate of a dielectric stack comprising vertically interleaved sacrificial layers and dielectric layers. Each of the plurality of sectors is at different depths. In each of the plurality of sectors, a plurality of stairs are formed towards a center of the plurality of sectors in a radial direction in the plan view, such that each stair of the plurality of sectors are at different depths.

In some embodiments, to form the plurality of sectors, a plurality of subsets of the plurality of sectors are sequentially forming, each subset of the plurality of sectors being at a same depth, and at least some of the plurality of sectors are chopped, such that each sector are at different depths.

In some embodiments, to sequentially form the plurality of subsets of the plurality of sectors, a first sector mask including a first opening for a first subset of the plurality of subsets of the sectors is patterned, one or more pairs of the sacrificial layers and dielectric layers are etched through the first sector mask, a second sector mask including a second opening for a second subset and the first subset of the plurality of subsets of the sectors is patterned, and one or more pairs of the sacrificial layers and dielectric layers are etched through the second sector mask.

In some embodiments, each subset of the sectors includes a pair of symmetric sectors with respect to the center of the sectors.

In some embodiments, to chop the at least some of the plurality of sectors, a chop mask including an opening of the at least some of the plurality of sectors is patterned, and a plurality of pairs of the sacrificial layers and dielectric layers are etched through the chop mask.

In some embodiments, to form the plurality of stairs in each of the plurality of sectors, a trim-etch mask including an opening of part of the plurality of sectors is patterned, and a plurality of trim-etch cycles are performed through the trim-etch mask towards the center of the plurality of sectors in the radial direction.

In some embodiments, a concentric zone including a plurality of stairs in a tangential direction in the plan view is formed by each of the plurality of trim-etch cycles.

In some embodiments, after forming the plurality of stairs in each of the plurality of sectors, a memory stack including vertically interleaved conductive layers and the dielectric layers is formed by replacing the sacrificial layers of the dielectric stack with the conductive layers.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory array structure; and
a concentric staircase structure in an intermediate of the memory array structure, wherein the concentric staircase structure comprises:
a plurality of stairs at different depths,
a plurality of concentric zones in a radial direction in a plan view, and each of the plurality of concentric zones is a respective concentric ring with respect to a common center of the concentric staircase structure, and comprises a corresponding subset of stairs in a tangential direction in the plan view, and
a plurality of sectors in the tangential direction, and each of the plurality of sectors is defined between two adjacent radial lines from the common center of the concentric staircase structure that form boundaries of the stairs, and comprises a corresponding subset of stairs in the radial direction in the plan view,
wherein each of the plurality stairs is an overlap between one corresponding concentric zone and one corresponding sector.

2. The 3D memory device of claim 1, wherein the plurality of stairs in each of the plurality of concentric zones have a nominally same lateral dimension.

3. The 3D memory device of claim 1, wherein the plurality of concentric zones are at different depths.

4. The 3D memory device of claim 1, wherein the plurality corresponding subset of stairs in each of the plurality of sectors have different lateral dimensions.

5. The 3D memory device of claim 1, wherein the plurality of sectors are at different depths.

6. The 3D memory device of claim 1, wherein the concentric staircase structure has a concentric circles layout.

7. The 3D memory device of claim 1, wherein the memory array structure comprises vertically interleaved conductive layers and dielectric layers, and a height of each stair is equal to a total thickness of one or more pairs of the conductive layers and dielectric layers.

8. The 3D memory device of claim 1, wherein a bottom stair of a higher concentric zone is higher than a top stair of a lower concentric zone in every pair of adjacent concentric zones.

9. The 3D memory device of claim 1, wherein a bottom stair of a higher sector is higher than a top stair of a lower sector in every pair of adjacent sectors.

10. The 3D memory device of claim 1, wherein an angle between two adjacent radial lines is equal to or less than 90 degrees.

11. A method for forming a concentric staircase structure of a three-dimensional (3D) memory device, comprising:
    forming a plurality of sectors in a tangential direction in a plan view in an intermediate of a dielectric stack comprising vertically interleaved sacrificial layers and dielectric layers, wherein each of the plurality of sectors is at different depths; and
    in each of the plurality of sectors, forming a plurality of stairs towards a center of the plurality of sectors in a radial direction in the plan view, such that each stair of the plurality of sectors are at different depths;
    wherein forming the plurality of sectors comprises simultaneously forming each pair of symmetric sectors with respect to the center of the sectors.

12. The method of claim 11, wherein forming the plurality of sectors comprises:
    sequentially forming a plurality of subsets of the plurality of sectors, each subset of the plurality of sectors being at a same depth; and
    chopping at least some of the plurality of sectors, such that each sector is at different depths.

13. The method of claim 12, wherein sequentially forming the plurality of subsets of the plurality of sectors comprises:
    patterning a first sector mask comprising a first opening for a first subset of the plurality of subsets of the sectors;
    etching one or more pairs of the sacrificial layers and dielectric layers through the first sector mask;
    patterning a second sector mask comprising a second opening for a second subset and the first subset of the plurality of subsets of the sectors; and
    etching one or more pairs of the sacrificial layers and dielectric layers through the second sector mask.

14. The method of claim 13, wherein chopping the at least some of the plurality of sectors comprises:
    patterning a chop mask comprising an opening of the at least some of the plurality of sectors; and
    etching a plurality of pairs of the sacrificial layers and dielectric layers through the chop mask.

15. The method of claim 11, wherein forming the plurality of stairs in each of the plurality of sectors comprises:
    patterning a trim-etch mask comprising an opening of part of the plurality of sectors; and
    performing a plurality of trim-etch cycles through the trim-etch mask towards the center of the plurality of sectors in the radial direction.

16. The method of claim 15, wherein a concentric zone comprising a plurality of stairs in a tangential direction in the plan view is formed by each of the plurality of trim-etch cycles.

17. The method of claim 11, further comprising:
    after forming the plurality of stairs in each of the plurality of sectors, forming a memory stack comprising vertically interleaved conductive layers and the dielectric layers by replacing the sacrificial layers of the dielectric stack with the conductive layers.

\* \* \* \* \*